(12) United States Patent
Harrington

(10) Patent No.: US 11,502,861 B2
(45) Date of Patent: Nov. 15, 2022

(54) SIMULATED AUDITORY SPACE FOR ONLINE MEETINGS

(71) Applicant: T-Mobile USA, Inc., Bellevue, WA (US)

(72) Inventor: Richard Harrington, Bellevue, WA (US)

(73) Assignee: T-MOBILE USA, INC., Bellevue, WA (US)

( * ) Notice: Subject to any disclaimer, the term of this patent is extended or adjusted under 35 U.S.C. 154(b) by 117 days.

(21) Appl. No.: 16/994,873

(22) Filed: Aug. 17, 2020

(65) Prior Publication Data

US 2022/0052863 A1     Feb. 17, 2022

(51) Int. Cl.
*H04L 12/18* (2006.01)
*G10L 15/26* (2006.01)
*H03G 3/30* (2006.01)

(52) U.S. Cl.
CPC .......... *H04L 12/1813* (2013.01); *G10L 15/26* (2013.01); *H03G 3/301* (2013.01)

(58) Field of Classification Search
CPC ..... H04L 12/1813; H04S 7/302; H04S 7/303; G10L 15/26
See application file for complete search history.

(56) References Cited

U.S. PATENT DOCUMENTS

| | | | |
|---|---|---|---|
| 7,006,616 B1 * | 2/2006 | Christofferson | H04L 65/4038 379/202.01 |
| 8,432,431 B2 | 4/2013 | Gorzynski et al. | |
| 9,372,251 B2 | 6/2016 | Soulodre | |
| 9,959,676 B2 | 5/2018 | Barzuza et al. | |
| 10,735,858 B2 * | 8/2020 | Sculley | H04S 7/302 |
| 10,819,953 B1 * | 10/2020 | Lovitt | G06F 16/487 |
| 2008/0201196 A1 * | 8/2008 | Rowland | G06Q 10/109 705/7.13 |
| 2010/0316232 A1 * | 12/2010 | Acero | H04R 27/00 379/202.01 |
| 2012/0016926 A1 * | 1/2012 | Toga | H04L 67/38 709/203 |
| 2014/0098183 A1 * | 4/2014 | Smith | H04N 13/254 348/E7.083 |
| 2014/0152758 A1 * | 6/2014 | Tong | H04N 7/147 348/14.02 |
| 2015/0246283 A1 * | 9/2015 | Russo | G07F 17/3211 463/31 |
| 2017/0351476 A1 | 12/2017 | Yoakum | |
| 2018/0033332 A1 * | 2/2018 | Nelson | G06F 3/04817 |
| 2018/0123813 A1 * | 5/2018 | Milevski | H04S 7/303 |
| 2018/0199136 A1 * | 7/2018 | Sculley | H04R 3/12 |

(Continued)

*Primary Examiner* — Douglas B Blair
(74) *Attorney, Agent, or Firm* — Summit Patents PC

(57) ABSTRACT

A virtual meeting system is discussed herein. An online meeting application places participants in their own virtual location with a common virtual meeting space and adjusts the audio volume and balance on a listener's device to simulate the virtual location of the participant who is speaking. The application includes a trigonometric function to adjust the audio volume and balance based on the location of the listener relative to the speaker. The application can also permit the participants to select their own virtual locations upon entry to the virtual meeting, can assign a virtual location or adjust audio based on a participant's settings, or can allow for parallel meetings.

19 Claims, 5 Drawing Sheets

(56) References Cited

U.S. PATENT DOCUMENTS

| | | | | |
|---|---|---|---|---|
| 2019/0253667 A1* | 8/2019 | Valli | .................... | H04N 7/157 |
| 2019/0297304 A1* | 9/2019 | Li | ........................... | G06T 7/20 |
| 2020/0043481 A1* | 2/2020 | Xiong | ................... | G06F 40/263 |
| 2021/0399911 A1* | 12/2021 | Jorasch | ............... | H04L 12/1822 |
| 2022/0021845 A1* | 1/2022 | Schneider | ........... | G06F 3/04847 |

* cited by examiner

SIMULATED AUDITORY SPACE FOR ONLINE MEETINGS

BACKGROUND

Currently, virtual meetings have minimal functionality or engagement beyond placing multiple participants in a virtual group meeting with video capabilities. Virtual meetings, such as for work, school, or conferences, provide a platform by which participants or users can communicate or interact via a remote connection. The virtual meeting can include audio, video, or both, and can further allow for screen sharing.

A conventional virtual meeting is more akin to talking to someone on the phone, rather than participating in an in-person meeting. Conventional virtual meetings do not accurately simulate an in-person meeting where the participants occupy the same room or space. Rather, the virtual meeting places participants in distinct locations. This can reduce participant engagement and interpersonal interactions, which can decrease productivity during the virtual meeting.

What is needed is a more immersive virtual meeting system having greater functionality.

DETAILED DESCRIPTION

A virtual meeting system is discussed herein that provides a more true-to-life virtual meeting experience with enhanced functionality that helps increase meeting participant engagement, productivity, and interpersonal interaction. An online meeting application places meeting participants in their own virtual location with a common virtual meeting space and causes an audio parameter, such as the audio volume and balance on a listener's device, of a user equipment of the meeting participants to adjust or change to simulate a virtual location of the participant who is speaking in the virtual meeting space.

The application includes a trigonometric function to calculate an adjustment to the audio volume (i.e., total decibel output) and balance (i.e., relative left and right audio volume) based on the location of the listener relative to the speaker (e.g., a virtual distance and virtual angle between the speaker and the listener). A server-side virtual meeting application can generate an instruction to adjust the volume or balance, process a signal to cause the audio signal transmitted to the user equipment to be output with an adjusted volume or balance, or both. A device-side virtual meeting application can receive the instruction or the processed signal from the server-side virtual meeting application and cause the device to perform the necessary action, can receive an audio signal from the server-side virtual meeting application and process the audio signal based on a parameter selected by the participant, or both.

The application can also permit the participants to select their own virtual location upon entry to the virtual meeting, can assign the virtual location or adjust audio based on a participant's requested or preset audio settings (e.g., hearing loss in the right ear, so the selected virtual location or audio settings increases volume and balance to a speaker or earbud on the left), or can allow for parallel meetings (i.e., main speaker is heard by all and side conversations can be muted or have the audio settings reduced for non-participants).

Figure 1:
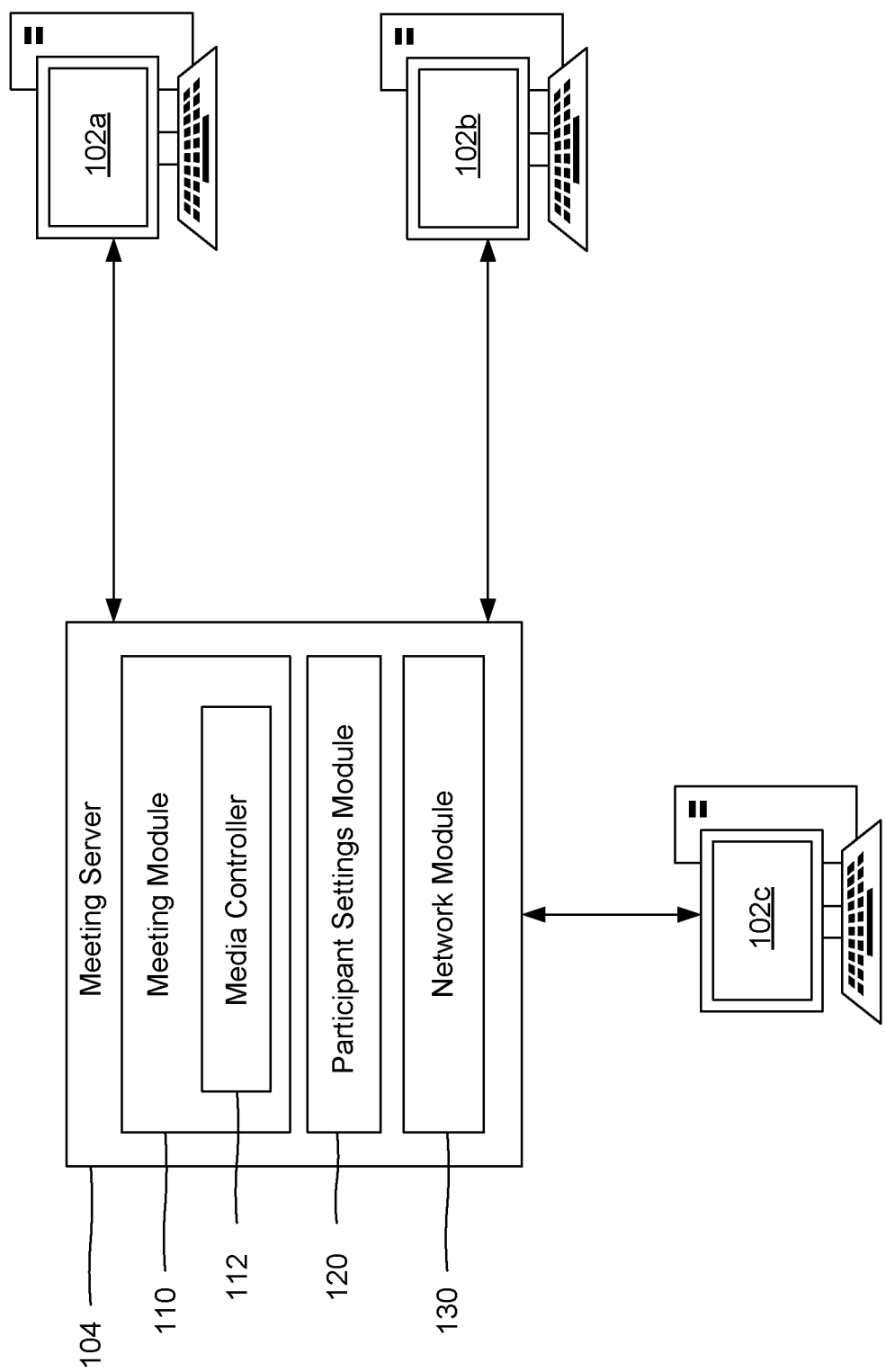
FIG. 1 illustrates an example network.

FIG. 1 shows a virtual meeting system including user equipment (UEs) 102a-102c connected to a meeting server 104. The meeting server 104 is computer hardware, software, or both that provides virtual meeting functionality to meeting participants. The meeting server 104 provides for video, audio, and web communication, including screen sharing, virtual meeting hosting, the like, and combinations or multiples thereof. The meeting server 104 further provides for participants to create and join meetings from a room or desktop video system, a mobile client, or a device having a browser or meeting application.

Each UE 102a-102c is any device used by an end-user or a participant to join the virtual meeting, including, without limitation, a room or desktop video system, a mobile client, a device having a browser or meeting application, a mobile phone, a smartphone, a tablet, a personal digital assistant, a laptop with network connectivity, a desktop computer with network connectivity, or the like. Each UE 102a-102c includes an audio output configured to output audio based on an audio parameter. The audio output can be a speaker, headphones, earbuds, an audio out jack, the like, or combinations or multiples thereof. The audio parameter can be balance (i.e., audio strength between left and right sides), fade (i.e., audio strength between front and back), volume (i.e., magnitude of the audio signal), or combinations or multiples thereof.

Each UE 102a-102c can be connected to or in communication with the meeting server 104 via one or more networks. The UEs 102a-102c can be connected to different networks or at least two UEs 102a-102c can be connected to the same network, such as when the at least two of the UEs 102a-102c are in the same room or building. The networks can include wired or wireless connections. The networks can be local area networks, wide area networks, or the like. The meeting server 104 and the UEs 102a-102c can communicate via a communication or transfer protocol, including TCP/IP, UDP, or both. A transmission control protocol (TCP) allows for communication over a network, such as by dividing any message into packets, which are sent to the destination from the source to be reassembled. An internet protocol (IP) is an addressing protocol, which is mostly used with TCP. The IP addresses of the packets, such as those formed by the TCP, to help route them through the network, such as via one or more nodes, until the packet or packets reach the destination. A user data protocol (UDP) is a communications protocol where data, such as in packets, are sent without a "handshake," thereby transmitting data before receiving party agrees to the communication.

The meeting server 104 includes a meeting module 110. The meeting module 110 includes software, algorithms, or both which provide virtual meeting functionality to meeting participants, including scheduling, video, audio, and web communications. The video includes screen-sharing, moving visual images, the like, or combinations or multiples thereof.

The meeting server 104 also includes a participant settings module 120. The participant settings module 120 receives and stores settings provided by the UE of the participant. The participant setting can include a participant-selected virtual location (i.e., participant selects their own virtual location upon entry to the virtual meeting), a hearing loss attribute, a parallel meeting attribute (i.e., main speaker is heard by all and side conversations can be muted or have the audio settings reduced for non-participants), the like, or combinations or multiples thereof.

The meeting module 110 also includes a media controller 112 to control how media (e.g., video, audio, or web communications) is received, processed, and transmitted to or from participants. The media controller 112 can receive participant settings from the participant settings module 120 to determine how, to whom, or how and to whom the media is transmitted.

The media controller 112 includes a signal processor, which includes a trigonometric function. The trigonometric function can be used by the meeting server 104 to process an audio signal received from a speaker's UE for transmission to a listener's UE. The audio signal is processed to adjust the volume, balance, or both to simulate the virtual location of the participant who is speaking relative to the virtual location of the listener. Additionally, or alternatively, the trigonometric function can also generate instructions for the listener's UE to adjust the volume, balance, or both to simulate the virtual location of the participant who is speaking relative to the virtual location of the listener.

The trigonometric function adjusts the audio signal, generates instructions to adjust the audio parameters (e.g., volume, balance, or both) of the listener's UE, or both based on the location of a virtual listener relative to a virtual speaker or presenter within a virtual space. The audio balance between the speaking participant and the listening participant is equal to (the balance range divided by 360°) times (the smallest separation angle, θ).

The balance can be adjusted such that the balance of the listener's UE is equal to (the balance range divided by 360°) times (the smallest separation angle, θ). In other words, $$\text{Listening Participant Audio Balance} = \frac{\text{Balance Range}}{360°} \times \theta$$

For example, when a balance range is 20 (e.g., 10 left to 10 right), and the speaking participant is separated to the right of the listening participant by 120° (or 240° to the left), the audio balance is +6.67 right ((20/360)×(120 right)). Therefore, the listening participant can still hear some audio from the left side though a majority of the audio will be heard by the right ear, such as would happen if the participants were physically standing in the same room at the same angles.

The volume can also be adjusted such that the volume of the listener's UE is equal to the distance between the virtual speaker and the virtual listener. Virtual participants that are closer in distance will generate an audio signal having a greater volume (e.g., magnitude is higher), whereas virtual participants that are further away will generate an audio signal having a lower volume (e.g., magnitude is lower).

In one example, the volume of the audio output of the UE of the listening participant is equal to (the volume range) times (a minimum distance/virtual participant distance). In other words, $$\text{Listening Participant Volume} = \frac{\text{Minimum Permitted Virtual Distance}}{\text{Actual Virtual Distance}} \times (\text{Volume Range})$$

For example, for the first virtual participant 202a, the volume relative to the third virtual participant 202c, for a 20 range volume and 5 units minimum virtual distance, is (5 units/d in virtual distance units)×20.

Though the processed audio signal or instructions include absolute values for the audio parameters (e.g., balance and volume), the instruction can include normalized values or relative values. For example, the processed audio signal or instruction can cause the balance to adjust by a certain percentage of the balance range such that each audio output adjustment reflects the proper separation angle.

The meeting server 104 also includes a network module 130 programmed to permit the meeting server 104 to communicate with the UEs via one or more networks. The meeting server 104 and the UEs can communication via a communication or transfer protocol, including TCP/IP, UDP, or both.

Though the meeting server 104 is discussed as a centralized server, the meeting server 104 need not be so limited. The meeting server 104 can be a decentralized media controller. The logic can decentralized with each UE 102a-102c having a different configuration.

Figure 2:
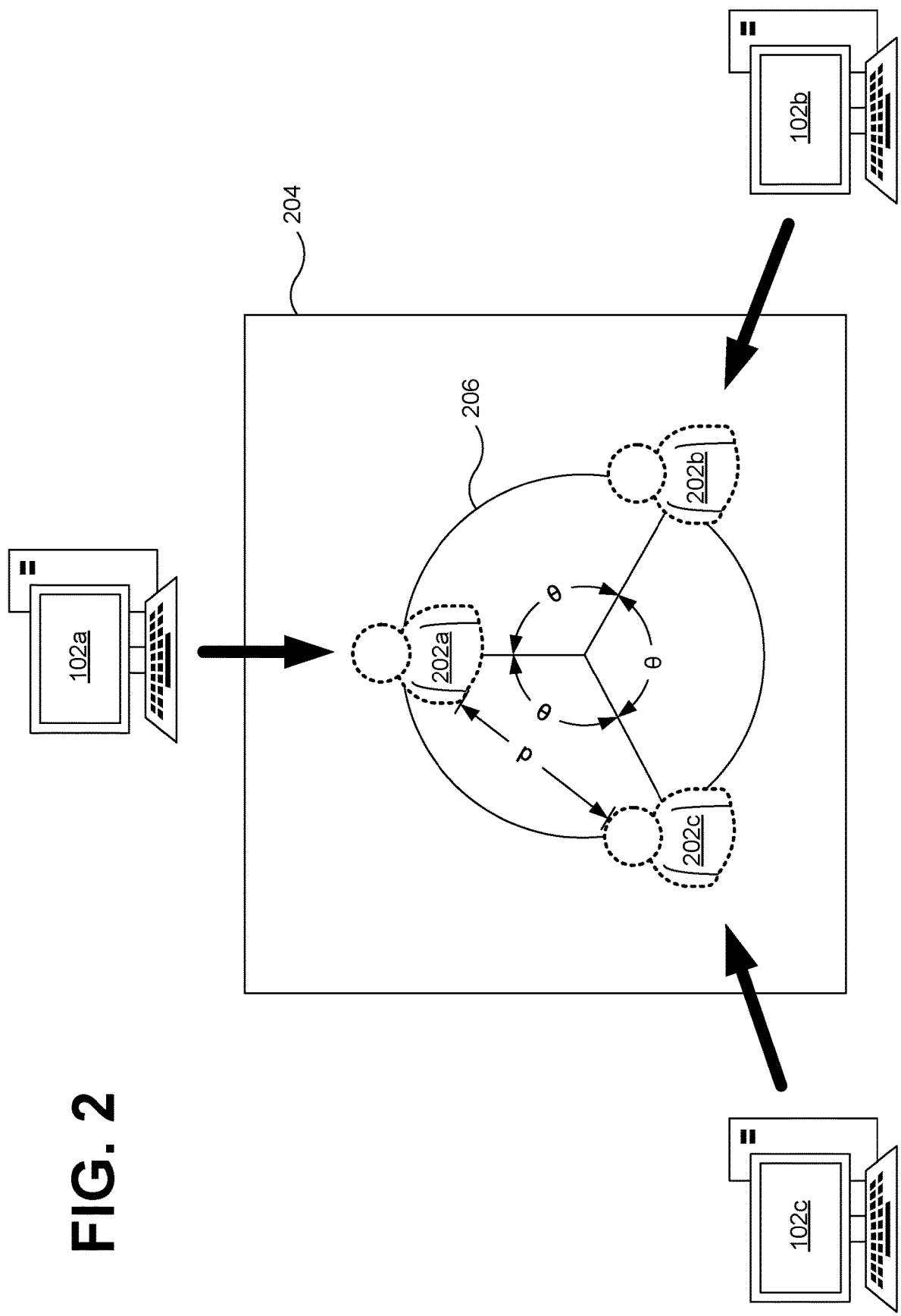
FIG. 2 illustrates an example virtual meeting.

FIG. 2 shows a virtual meeting in a virtual space 204. Virtual participants 202a-202c represent the participants using UEs 102a-102c, respectively. The virtual participants 202a-202c are placed in the virtual space 204 around a virtual table 206. The virtual participants 202a-202c can be placed evenly around the virtual table 206.

A separation angle (θ) between adjacent virtual participants when the virtual participants are equally spaced around the virtual table 206 is equal to 360° divided by the total number of virtual participants.

For example, in FIG. 2, there are 3 virtual participants 202a-202c. Each virtual participant is separated by 120° from an adjacent virtual participant. A first virtual participant 202a is separated from a second virtual participant 202b by 120° and a third virtual participant 202c by 120°. The second virtual participant 202b is separated from the third virtual participant 202c by 120° and the first virtual participant 202a by 120°. The third virtual participant 202c is separated from the second virtual participant 202b by 120° and the first virtual participant 202a by 120°.

As participants enter the virtual space 204 (i.e., by joining the virtual meeting), the relative virtual locations of each participant around the virtual table 206 can be adjusted, such that each participant is equally separated from an adjacent participant. For example, when a fourth participant joins, the virtual participants can be separated by 90°. Alternatively, the relative virtual locations of the participants who were already in the virtual meeting can be maintained, while a new participant can be spaced differently than at least one other participant. For example, when a fourth participants joins, the first three virtual participants will remain separated by 120° while the fourth virtual participant is placed between two of the virtual participants. So, a first virtual participant is separated from a second and third virtual participants by 120°. When a fourth virtual participant joins, the fourth virtual participant can be placed between the first and third virtual participants (i.e., fourth virtual participant is separated from the first and third virtual participants by 60°), while maintain first and third virtual participant separated at 120°.

A trigonometric function can be used by the meeting server to generate the instructions to adjust the audio parameter of the audio output of the UEs 102a-102c based on the location of the virtual participants 202a-202c around the virtual table 206. The UEs 102a-102c are associated with the virtual participants 202a-202c, respectively. The trigonometric function can generate the instruction to adjust the audio parameter based on the relative positions of two participants of interest—a speaking participant and a listening participant.

Figure 3:
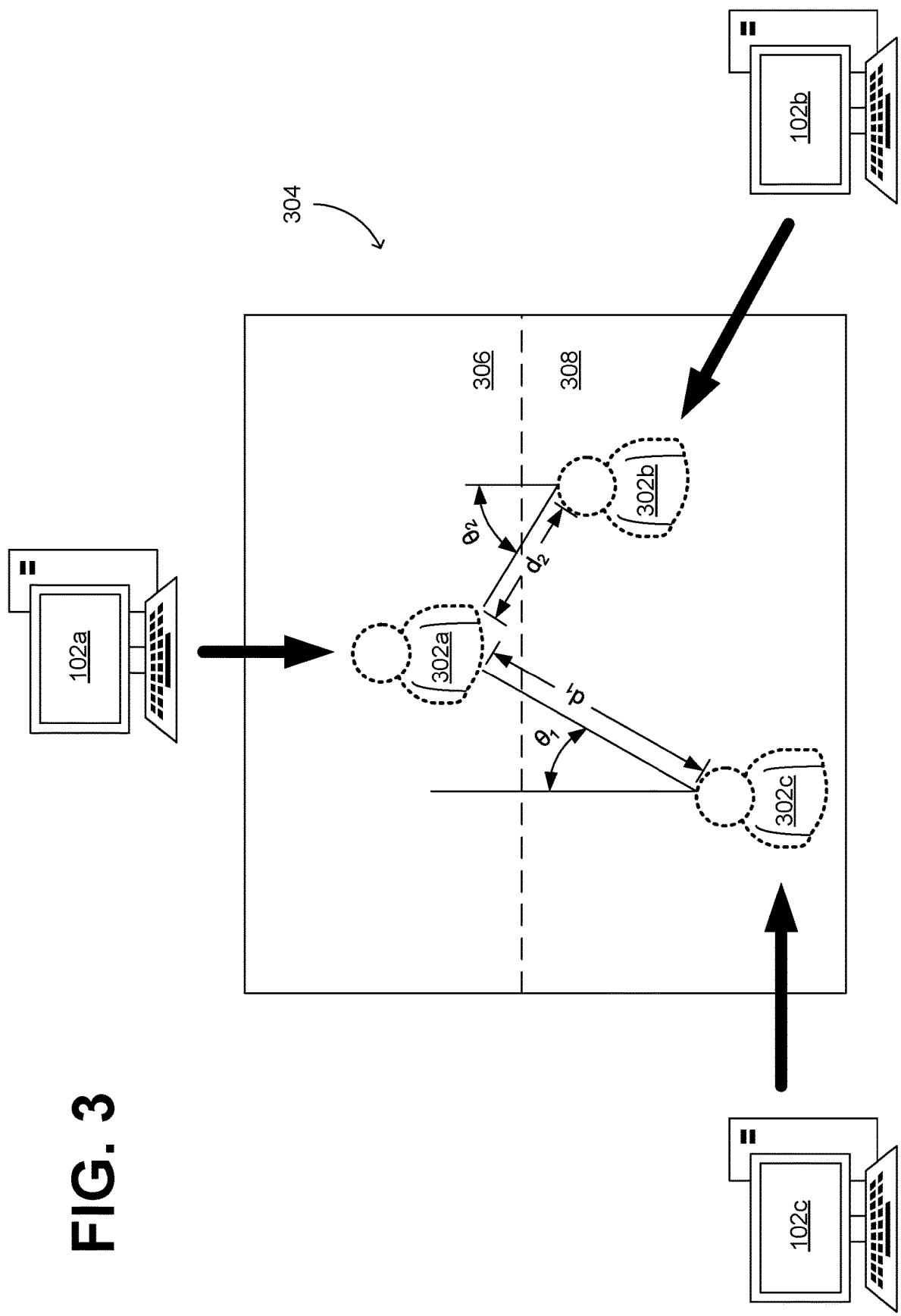
FIG. 3 illustrates another example virtual meeting.

FIG. 3 shows a virtual meeting, such as a presentation or webinar, in a virtual space 304, which has a presenter and attendees. A virtual presenter 302a, which represents the participant associated with the UE 102a, is at a front portion 306 of the virtual space 304. Two virtual attendees 302b, 302c, which represent participants associated with 102b, 102c, respectively, are at a back portion 308 of the virtual space 304. The virtual presenter 302a can be audible to everyone, while the virtual attendees 302b, 302c are not audible to anyone else, unless the virtual attendee has been granted permission (such as to ask a question and is then inaudible thereafter) or when participating in a parallel conversation.

In one example, the virtual presenter 302a can be a teacher and the virtual attendees 302b, 302c can be students. In another example, the virtual meeting can include multiple presenters.

A trigonometric function can be used by the meeting server to generate the instructions to adjust the audio parameter of the audio output of the UEs 102a-102c associated with the virtual participants 302a-302c, respectively, based on the location of the virtual attendees 302b, 302c relative to the virtual presenter 302a within the virtual space 304. The trigonometric function determines the audio parameter based on the relative positions of the virtual attendees 302b, 302c relative to the virtual presenter 302a. The audio balance between the speaking participant and the listening participant is equal to (the balance range divided by 360°) times (the smallest separation angle).

For example, for the first virtual attendee 302b, the balance, for a 20 range balance, is $(20/360) \times \theta_1$. For the second virtual attendee 302c, the balance, for a 20 range balance, is $(20/360) \times \theta_2$.

The instruction can also cause the volume to be adjusted based on the distance between the virtual participants. Virtual participants that are closer in distance will generate an audio signal having a greater volume (e.g., magnitude is higher), whereas virtual participants that are further away will generate an audio signal having a lower volume (e.g., magnitude is lower). For example, the volume of the audio output of the UE of the listening participant is equal to (the volume range) times (a minimum distance/virtual participant distance).

For example, for the first virtual attendee 302b, the volume, for a 20 range volume and 5 units minimum virtual distance, is (5 units/$d_1$ in virtual distance units)×20. For the second virtual attendee 302c, the volume, for a 20 range volume and 5 units minimum virtual distance, is (5 units/$d_2$ in virtual distance units)×20.

Figure 4:
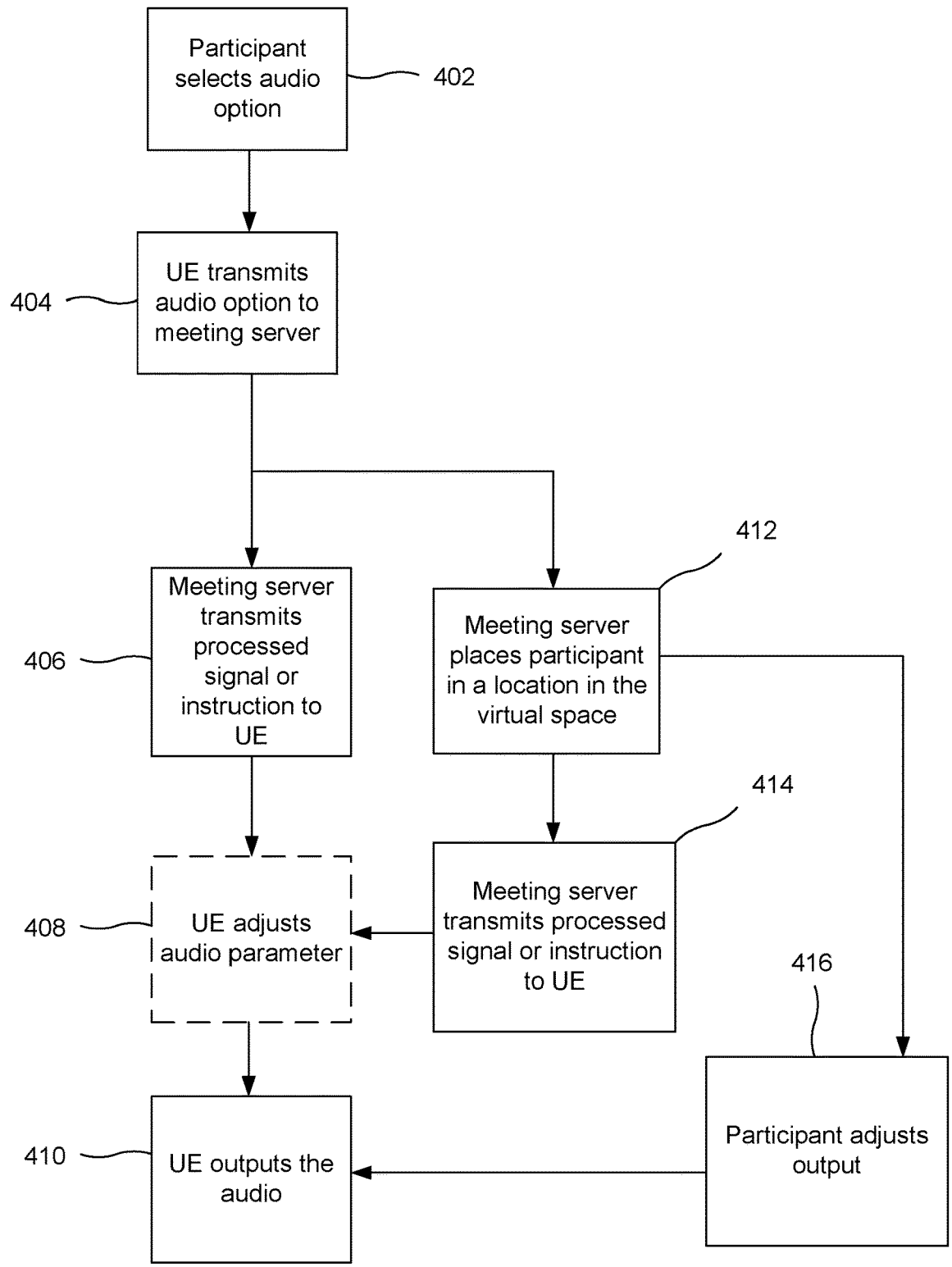
FIG. 4 illustrates an example process.

FIG. 4 shows a process for adjusting an audio parameter of a UE of a participant based on a participant setting. The participant can hearing loss (HL). At 402, the participant selects an audio option, such as "hearing loss" setting and designates the ear in which that participant has hearing loss (e.g., "left ear," "right ear," or "both ears"), a participant-selected virtual location, combinations or multiples thereof, or the like. The audio setting can be saved to the device-side application on the UE for use in future virtual meetings, can be stored in the participant settings module 120 of the meeting server 104 for when the participant associated with the audio option is determined to be active on a virtual meeting, or both. The participant is active or is actively participating when the UE of the participant is communicating with the meeting server during or in furtherance of the virtual meeting.

At 404, such as when the audio option is saved on the UE or when the participants uses the meeting application for the first time, the UE transmits the audio option to the meeting server, which stores the audio option within the participant settings module. To do so, the UE generates a signal including the audio option. The UE then transmits the signal to the meeting server, such as via one or more networks. Alternatively, the audio option, having been stored in the participant settings module 120 of the meeting server 104, can be requested by or transmitted to the meeting module 110 when the participant associated with the audio option is determined to be active on the virtual meeting by the meeting server 104.

The audio option can then be transmitted from the participant settings module to the media control, which can generate an instruction based on the audio option, process an audio signal based on the audio option, or both.

At 406, the meeting server transmits a processed signal to the participant's UE, generates an instruction to adjust an audio parameter of an audio output of the participant's UE, or both. The processed signal can include an adjusted audio parameter (e.g., volume, balance, or both) based on the audio option. The instruction can cause the UE to adjust the balance, the volume, or both.

Balance can be adjusted to accommodate a participant having hearing loss in an ear, such that the balance is directed away from the ear in which hearing loss occurs. The balance can be adjusted within a process signal or directly on the participant UE by an instruction from the meeting server. Volume can be adjusted within a process signal or directly on the participant UE by an instruction from the meeting server. The meeting server can also generate and transmit an instruction to the participant's UE to display closed captions, whether the closed captions are generated by software or an application of the UE or generated and transmitted by the meeting server to the UE. The meeting server can transmit the closed captions in the same transmission as the instructions or in a different transmission concurrently with the instructions, before the instructions, or after the instructions.

Optionally, at 408, the UE of the participant can adjust the audio parameter based on a received instruction. The volume, balance, or both of the audio output can be adjusted. The UE can also display or generate and display closed captions based on the instruction as an alternative or in addition to adjusting the audio parameter of the audio output on the UE.

The UE receives a media signal from the meeting server. The media signal can include an audio signal, a video signal, or both. At 410, the UE outputs the audio from the audio output based on the received audio signal, the audio output settings, or both.

In one example, after the UE transmits the setting, at 412, the meeting server can place the participant in a location within the virtual space based on the audio option. For example, when the participant selects the HL setting and designates that the participant is HL in the right ear, the participant can be placed towards the right side of the virtual space. This causes the other participants to be located on the left side of the participant within the virtual space and therefore more proximal to the left ear of the participant. The virtual space can permit multiple people to be positioned at the same virtual location if the participants have the same audio parameters, including the HL setting.

At 414, the meeting server transmits a processed signal to the participant's UE, generates an instruction to adjust an audio parameter of an audio output of the participant's UE, or both.

At 416, after being placed within the virtual meeting at a virtual location, the participant can adjust the audio output to their preferences, as a test, or both.

Figure 5:
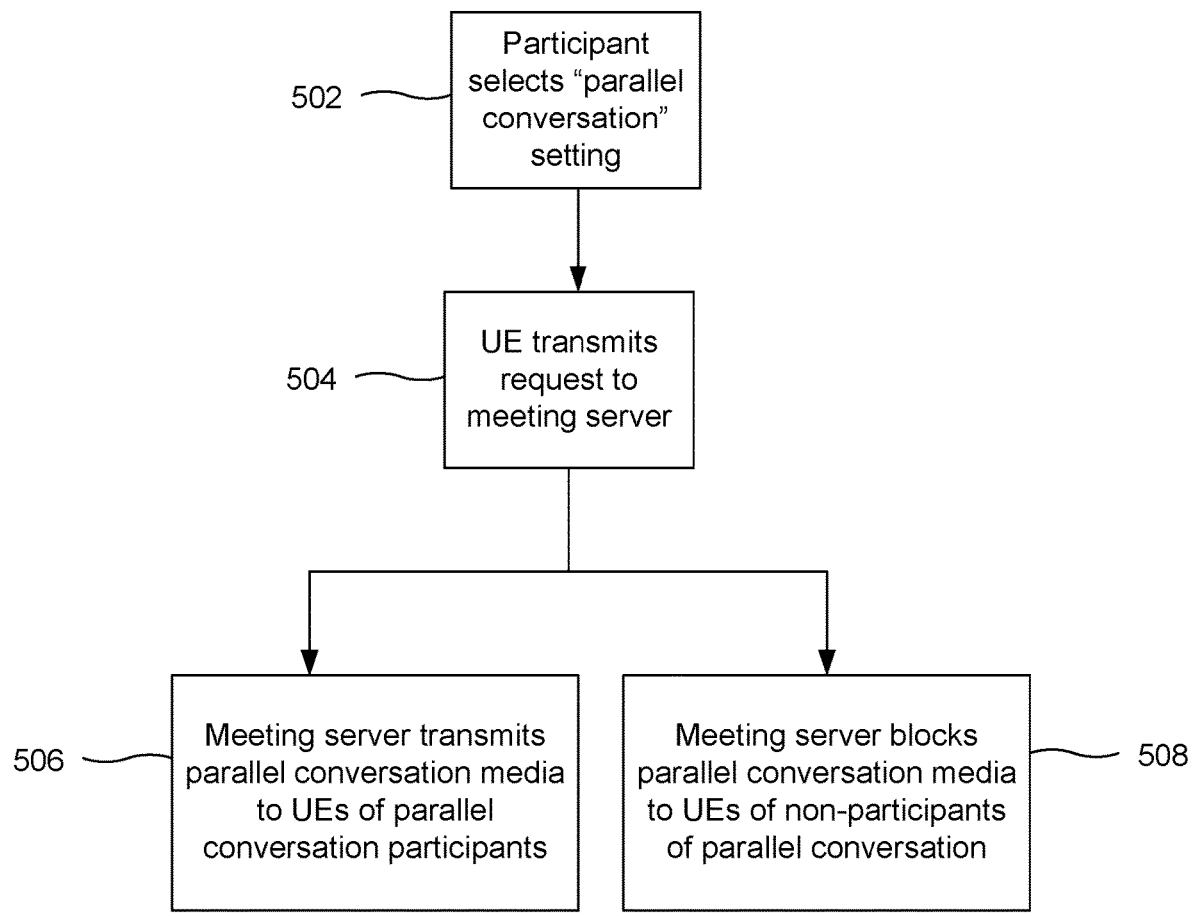
FIG. 5 illustrates an example process.

FIG. 5 shows a process to provide a parallel virtual meeting between two or more main virtual meeting participants. The parallel virtual meeting permits two or more main virtual meeting participants to have a meeting in parallel with the main virtual speaker or presentation while still participating in the main virtual meeting. Therefore, the participants of the parallel virtual meeting do not have to connect via another device or application and can avoid disrupting the main virtual meeting. The parallel virtual meeting can permit two separate meetings (i.e., one with all participants and one with a subset of all participants), two audio sources between a subset of participants, or both.

A main communication link is established and provides access to a main virtual meeting for all participants. During the main virtual meeting, a subset of participants would like to have a parallel virtual meeting. One of the participants can initiate a parallel virtual meeting. A parallel communication link is established and provides access to the parallel to a subset of participants. The subset of participants can meet with each other while the conversation is not transmitted to the UEs of the participants not included in the subset of participants. The meeting server can establish the main and parallel communication links.

An output, such as that of the meeting server, can transmit a main media signal over the main communication link to all of the multiple participants. The main media signal is associated with the main virtual meeting and includes instructions to output audio data, visual data, or audio and visual data of the main virtual meeting on respective user devices of each of the multiple participants. The output can also transmit a parallel media signal over the parallel communication link to the subset of the multiple participants. The parallel media signal is associated with the parallel virtual meeting and transmitted concurrently with the main media signal. The parallel media signal includes instructions to output audio data, visual data, or audio and visual data of the parallel virtual meeting on respective user devices of each of the subset of the multiple participants. The main and parallel media signals can be transmitted in real-time.

At 502, a first participant selects a "parallel meeting" setting and further selects a second participant with whom the first participant can converse in the parallel virtual meeting. The first participant can also select more than one other participant.

At 504, the UE of a main meeting participant transmits a parallel meeting request to the meeting server. The meeting server then transmits a parallel meeting invitation to the UE of the second participant. The second participant then responds to the parallel meeting invitation. When the second participant does not accept the parallel meeting request (i.e., responds in the negative), the meeting server does not initiate a parallel virtual meeting and transmits a rejection notification to the first participant. When the second participant accepts the parallel meeting request (i.e., responds in the affirmative), the meeting server initiates a communication channel between the first participant and the second participant as the parallel virtual meeting.

The parallel virtual meeting participants can communicate in the same manner as they would via the main virtual meeting, such as over audio, video, or both. At 506, the parallel meeting participants can communicate via the meeting server, similarly to the manner in which all participants communicate within the main virtual meeting via the meeting server. However, the parallel virtual meeting only transmits the communications between the parallel meeting participants, rather than all main meeting participants.

The parallel meeting participants can also hear, see, or hear and see the main meeting communications. The parallel meeting can begin before the main meeting and continue after the main meeting ends. It can also be intermittent throughout the main meeting or can start and end anytime during the main meeting.

At 508, the meeting server can provide a separate communication channel or communication link between the parallel meeting participants, such as by running a second meeting only between the parallel meeting participants.

Alternatively, the meeting server blocks the parallel meeting communications from being transmitted to the participants of the main virtual meeting who are not participating in the parallel virtual meeting. To do so, the meeting server determines which main meeting participants are involved in the parallel virtual meeting, such as with a parallel meeting participant lookup table. The lookup table includes the subset of the multiple participants selected by one of the multiple participants. The parallel meeting communications are transmitted between parallel meeting participants via the meeting server. The meeting server, therefore, does not transmit the parallel meeting communications to non-participants of the parallel meeting. In one example, the video of the parallel meeting participants can be frozen for the main virtual meeting, while still transmitting the video to the parallel meeting participants. The meeting server can pause the video, save the last image before the parallel virtual meeting was initiated, or block video to the participants of the main virtual meeting who are not in the parallel virtual meeting.

For example, the first and second participants of a main virtual meeting initiate a parallel virtual meeting. The first and second participants communicate with each in the parallel virtual meeting via the meeting server while also receiving main meeting communications. However, no one else in the main virtual meeting can hear, see, or hear and see communications between the first and second participants within the parallel meeting.

As another example, breakout sessions from a main meeting can be formed via the parallel meeting option with a subset of participants in each breakout session. A presenter or participant can join or engage with one or more breakout sessions simultaneously.

Embodiments of the invention can include a non-transitory computer readable medium, which can store instructions for performing the above-described methods and any steps thereof, including any combinations of the same. For example, the non-transitory computer readable medium can store instructions for execution by one or more processors or similar devices.

Further embodiments of the present invention can also include the one or more user equipment(s), networks, or servers which read out and execute computer executable instructions, such as a non-transitory computer-readable medium, recorded or stored on a storage medium (which may be the same as or different than the storage medium for storing images or files, as discussed above), to perform the functions of any embodiment. The user equipment or server may include one or more of a central processing unit (CPU), micro processing unit (MPU), or other circuitry, such as a processor, and may include a network of separate user equipment or servers or separate computer processors. The computer executable instructions may be provided to the user equipment, network node, or server, for example, from a network or the storage medium.

Though certain elements, aspects, components or the like are described in relation to one embodiment or example of a virtual meeting, those elements, aspects, components or the like can be including with any other virtual meeting, such as when it desirous or advantageous to do so.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific embodiments or examples are presented by way of examples for purposes of illustration and description. They are not intended to be exhaustive of or to limit this disclosure to the precise forms described. Many modifications and variations are possible in view of the above teachings. The embodiments or examples are shown and described in order to best explain the principles of this disclosure and practical applications, to thereby enable others skilled in the art to best utilize this disclosure and various embodiments or examples with various modifications as are suited to the particular use contemplated. It is intended that the scope of this disclosure be defined by the following claims and their equivalents.

What is claimed is:

1. A system for presenting a virtual meeting, the system comprising:
    a processor;
    a non-transitory storage medium;
    instructions stored in the non-transitory storage medium, the instructions being executable by the processor to:
        receive a hearing loss attribute of a participant in the virtual meeting,
        determine an adjustment to an audio parameter of an audio signal received by a participant device during active participation of the participant in the virtual meeting, the audio parameter based on the hearing loss attribute,
        place the participant in a virtual space relative to a location of a speaker in the virtual space based on the hearing loss attribute, and
        create an adjusted audio signal based on the adjustment to the audio parameter of the audio signal and the active participation of the participant in the virtual meeting; and
    an output configured to transmit the adjusted audio signal to the participant device.

2. The system of claim 1, wherein the hearing loss attribute includes an ear designation configured to represent an ear in which the participant has hearing loss.

3. The system of claim 2, wherein the virtual space is a virtual room, and wherein the participant is placed on the same side of the virtual room as that of the ear designation.

4. The system of claim 3, wherein the ear designation is left and the side of the virtual room is the left side, or wherein the ear designation is right and the side of the virtual room is the right side.

5. The system of claim 1, wherein the adjustment is based on an angle of the participant relative to another participant who is speaking within the virtual space.

6. The system of claim 5, wherein the audio parameter is relative left and right audio volume.

7. The system of claim 1, wherein the adjustment is based on a distance of the participant relative to another participant who is speaking within the virtual space.

8. The system of claim 7, wherein the audio parameter is audio volume.

9. The system of claim 1, wherein the audio parameter is relative left and right audio volume, audio volume, or both.

10. The system of claim 1, wherein the instructions are further executable by the processor to generate a closed captions signal including a transcription based on the audio signal.

11. The system of claim 10, wherein the output is further configured to output the closed captions signal to display the transcription on a visual device of the participant.

12. The system of claim 1, wherein the instructions are further executable by the processor to detect that the participant is actively participating in the virtual meeting.

13. The system of claim 1, wherein the instructions are further executable by the processor to place participants around a virtual table within the virtual meeting, the participants being separated from adjacent participants by an equal number of degrees.

14. The system of claim 1, wherein the instructions are further executable by the processor to introduce a new participant around a virtual table within the virtual meeting after the virtual meeting has started.

15. The system of claim 14, wherein the instructions are further executable by the processor to adjust a first amount of separation of adjacent participants to a second amount of separation of adjacent participants based on the introduction of the new participant.

16. The system of claim 14, wherein the instructions are further executable by the processor to place the new participant between two adjacent participants.

17. A method for presenting a virtual meeting, the method comprising:
    receiving a hearing loss attribute of a participant in the virtual meeting;
    determining an adjustment to an audio parameter of an audio signal received by a participant device during active participation of the participant in the virtual meeting, the audio parameter based on the hearing loss attribute;
    placing the participant in a virtual space relative to a location of a speaker in the virtual space based on the hearing loss attribute;
    creating an adjusted audio signal based on the adjustment to the audio parameter of the audio signal and the active participation of the participant in the virtual meeting; and
    transmitting the adjusted audio signal to the participant device.

18. The method of claim 17, wherein the adjustment is based on an angle of the participant relative to another participant who is speaking within the virtual space.

19. The method of claim 17, wherein the adjustment is based on a distance of the participant relative to another participant who is speaking within the virtual space.

* * * * *